United States Patent [19]

Vassiliou

[11] Patent Number: 4,854,229

[45] Date of Patent: Aug. 8, 1989

[54] SCREEN PRINTER APPARATUS

[75] Inventor: Eustathios Vassiliou, Newark, Del.

[73] Assignee: E. I. DuPont de Nemours and Company, Wilmington, Del.

[21] Appl. No.: 60,333

[22] Filed: Jun. 10, 1987

[51] Int. Cl.[4] .................... B41F 15/14; B41F 15/42
[52] U.S. Cl. .................................................. 101/123
[58] Field of Search ............. 101/123, 124, 126, 129, 101/114

[56] References Cited

U.S. PATENT DOCUMENTS

| | | | |
|---|---|---|---|
| 2,018,989 | 10/1935 | Wulf | 101/126 |
| 2,753,794 | 7/1956 | Groak | 101/124 |
| 3,001,786 | 9/1961 | Carrozza et al. | 271/44 |
| 3,445,310 | 5/1969 | Danielson et al. | 101/129 X |
| 3,731,623 | 5/1973 | Bubley et al. | 101/114 |
| 3,859,917 | 1/1975 | Bubley et al. | 101/123 |
| 3,921,521 | 11/1975 | Kudlich | 101/120 |
| 4,023,486 | 5/1977 | Linthicum et al. | 101/120 |
| 4,054,091 | 10/1977 | Bradley | 101/129 |
| 4,063,502 | 12/1977 | Cunningham | 101/123 |
| 4,111,118 | 9/1978 | Green et al. | 101/123 |
| 4,193,344 | 3/1980 | Ericsson | 101/126 |
| 4,216,716 | 8/1980 | Zimmer | 101/120 |
| 4,246,866 | 1/1981 | Hopings et al. | 118/213 |
| 4,254,707 | 3/1981 | Lambert et al. | 101/123 |
| 4,267,773 | 5/1981 | Scherp et al. | 101/123 |
| 4,268,545 | 5/1981 | Hodulik | 427/282 |
| 4,388,863 | 6/1983 | De Santis | 101/123 X |
| 4,404,903 | 9/1983 | Cronin | 101/123 |
| 4,493,254 | 1/1985 | Landesman et al. | 101/123 |
| 4,520,726 | 6/1985 | Rouly et al. | 101/123 |
| 4,537,126 | 8/1985 | Bubley | 101/123 |
| 4,549,484 | 10/1985 | Neese | 101/123 |
| 4,589,336 | 5/1986 | Klemm | 101/124 |

FOREIGN PATENT DOCUMENTS

| | | |
|---|---|---|
| 59081 | 4/1983 | Japan . |
| 90981 | 5/1983 | Japan . |
| 247116 | 1/1960 | Netherlands . |
| 788547 | 1/1958 | United Kingdom . |
| 1320470 | 6/1973 | United Kingdom . |

*Primary Examiner*—Clifford D. Crowder

[57] ABSTRACT

A screen printer is provided with a pivotally mounted substrate support plate or screen leveling members, each of which is operable to dispose a portion of the screen forwardly the wiper applicator into parallel relationship with and into close proximity to the surface of a substrate as a wiper applicator moves across the screen.

15 Claims, 3 Drawing Sheets

SCREEN PRINTER APPARATUS

BACKGROUND OF THE INVENTION

Field of the Invention. This invention relates to a screen printer apparatus for applying a paste-like material onto the surface of a substrate and, in particular, to a screen printer apparatus having an arrangement which maintains at least a portion of the screen forwardly of a wiper applicator in parallel relationship with and in predetermined close proximity to the surface of the substrate.

DESCRIPTION OF THE PRIOR ART

Thick film insulator and conductor compositions are paste-like materials which may be applied to the surface of a substrate, usually a ceramic, using a device known as a screen printer. U.S. Pat. Nos. 3,731,623 (Bubley et al.); 4,267,773 (Scherp et al.) and 4,520,726 (Rouly et al.) each disclose a screen printer apparatus.

The substrate onto which the composition is to be applied is usually carried on a fixed support plate. The screen printer includes a screen having a pattern of open and closed areas thereon. The open areas correspond to the areas of the substrate onto which it is desired to apply the thick film composition while the closed areas correspond to areas of the subtrate onto which no composition is to be deposited. Thus, when the thick film composition is urged across the surface of the screen using the edge of a flexible wiper applicator (also known to those skilled in the art as a "squeegee") the composition flows onto the substrate through the open portions of the screen and is prevented from flowing onto the substrate by the closed portions of the screen.

In a screen printer the screen is stretched tightly by and held in a suitable fixture such that (before the applicator is lowered to the screen to deflect the same) the plane of the screen lies a closely spaced distance "1" above and substantially parallel to the plane of the upper surface of the substrate when the same is supported on the plate. Typically, if the overall length of the screen is a dimension "L", the distance "1" between plane of the screen and the surface of the substrate is on the order of L/200.

As the wiper applicator moves in a predetermined direction across the screen the edge of the wiper applicator flexes and presses against the surface of the substrate, deflecting the screen and defining a line of contact between the screen and the substrate. The portion of the screen forwardly and rearwardly of the line of contact diverges from and defines a predetermined angle with respect to the planar surface of the substrate. This situation for a typical prior art screen printer is shown in FIG. 1.

Shown in FIG. 1 are the relative positions of the wiper applicator W and the screen S with respect to the ceramic substrate C supported on a fixed support plate P as the wiper applicator W moves across the screen S in the direction of the arrow V. As the edge E of the wiper applicator W moves across the screen S the screen is deflected and the line of contact K between the screen S and the substrate C is defined. The angles $\alpha$ and $\beta$ respectively are defined between the surface of the substrate C and the screen S forwardly and rearwardly of the line of contact K throughout the entire movement of the wiper applicator W.

It is believed advantageous to define as great an angle $\beta$ as possible between the portion of the screen behind the wiper applicator W to prevent temporary sticking of the screen S to the composition on the substrate C. When such sticking does occur instances have been observed where the screen suddenly snaps back from the substrate, thus causing discontinuities in the layer of composition being applied.

Prior art screen printer apparatus include pivotally mounted screen arrangements which assist in lifting that portion of the screen behind the wiper applicator W away from the substrate C. Exemplary of such devices are those shown in U.S. Pat. Nos. 3,859,917 (Bubley et al.); 4,254,707 (Lambert et al.); and 4,537,126 (Bubley).

The portion of the screen S forwardly of the wiper applicator W is also lifted from the substrate C to define the angle $\alpha$. As a result in prior art screen printer apparatus the puddle of composition in front of the wiper applicator W has a tendency to migrate around the edges of the closed portions of the pattern of the screen S. As these portions of the screen S are brought into contact with the substrate C by the action of the wiper applicator W the composition which has migrated to the undersurface of the closed portions of the screen S is applied to the surface of the substrate C. As a result composition is applied to surfaces of the ceramic substrate which are desired to be left free of composition.

For example, when creating a multiple layer structure on a ceramic substrate it is often desirable to leave on each applied layer an opening which registers with similar openings provided on some of the other adjacent layers to define what is known in the art as a "via". The pattern of the screen for each of the layers contains a closed portion corresponding in shape to the intended shape of the via. Due to the tendency of the composition to migrate under closed portions of the screen, for the reasons discussed above, vias tend to become constricted as multiple layers of composition are applied to a substrate.

In view of the foregoing it is believed advantageous to provide an arrangement whereby that portion of the screen forwardly of the wiper applicator is held in close proximity to the surface of the substrate thereby to inhibit the tendency of the thick film composition to migrate under the closed portions of the screen.

SUMMARY OF THE INVENTION

In accordance with the present invention a screen printer apparatus is provided which has an arrangement which maintains the screen forwardly of the line of contact with the wiper applicator into predetermined close proximity with the surface of the substrate. Preferably, the forward portion of the screen is maintained in contact with the surface of the substrate as the applicator is moved from the first to the second end of the screen.

In one embodiment of the invention the screen printer includes a pivotally mounted support plate. The plate is pivotal in response to a biasing force about a pivot axis that is disposed in the vicinity of the second end of the screen. By this it is meant that the pivot axis is located between the patterned area on the screen and a location adjacent to the second end of the screen in the plane of the undeflected screen and perpendicular to the direction of motion of the wiper applicator. Most preferably the pivot axis of the support plate is substantially coincidently aligned with the second end of the screen. The plate is biased for pivotal movement about the pivot axis by suitable means, such as a spring. A brace member moves beneath the support plate in synchronism with the movement of the wiper applicator across the surface of the screen. As a result, throughout the movement of the wiper applicator the end of the plate opposite the pivot axis is permitted to swing about the pivot axis so that portion of the screen forwardly of the applicator is maintained in parallelism with and in predetermined close proximity to (preferably in contact with) the surface of the substrate thereby to minimize the tendency of the thick film composition to migrate beneath closed portions of the screen.

In accordance with a second, alternately used, embodiment of the present invention the carrier for the wiper applicator is provided with first and second screen leveling members disposed forwardly of the wiper applicator. Preferably the members are laterally disposed on the carrier with the wiper applicator so as to overlie the lateral margins of the screen outwardly of the pattern thereon. As a result, as the applicator is moved across the screen the portion of the screen forwardly of the wiper applicator is pressed by the leveling members toward the surface of the substrate thereby to bring that portion of the screen immediately forwardly of the wiper applicator parallel to and into predetermined close proximity to (perferably in contact with) the surface of the substrate thereby to minimize the tendency of the thick film composition to migrate beneath closed portions of the screen.

BRIEF DESCRIPTION OF THE DRAWINGS

The invention will be more fully understood from the following detailed description thereof taken in connection with the accompanying drawings which form a part of this application and in which.

DETAILED DESCRIPTION OF THE INVENTION

Figure 1:
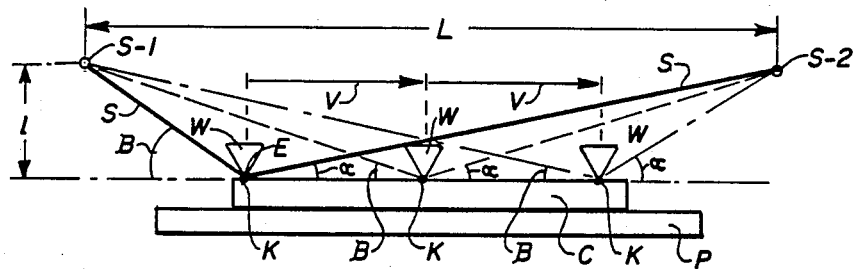
FIG. 1 is a stylized schematic representation of a screen printer apparatus in accordance with the prior art illustrating the divergence between the screen and the substrate both forwardly and rearwardly of the line of contact defined between the screen and the substrate by the edge of the wiper applicator as it deflects the screen and moves thereacross.

Throughout the following detailed description similar reference numerals refer to similar elements in all figures of the drawings.

Figure 2:
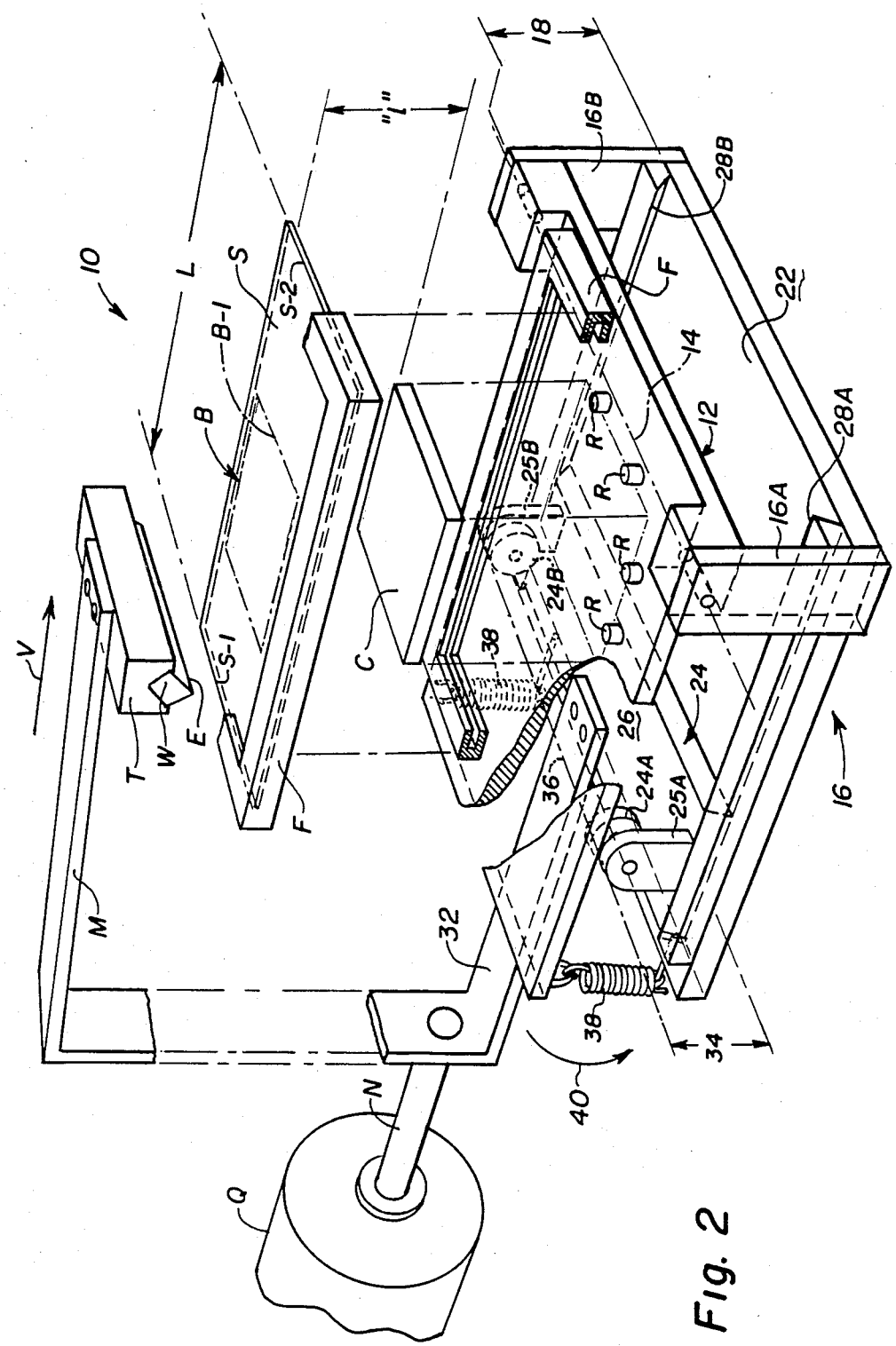
FIG. 2 is a stylized pictorial representation of a screen printer apparatus having a pivotally mounted support plate in accordance with the first embodiment of the present invention.

With reference to FIG. 2 shown is a highly stylized, pictorial, partially exploded representation of a screen printer apparatus generally indicated by reference character 10 with portions removed for clarity of illustration illustrating the first embodiment of the present invention. As is discussed earlier, a substrate to be printed, typically a ceramic substrate C of any predetermined size, is received on and supported by a generally planar support plate 12 in accordance with the invention. The plate 12 has, as is the usual practice, a suitably configured array of restraining pegs R arranged to accept the substrate C and to locate the same thereon. Although not illustrated in FIG. 2 a suitable vacuum connection is used to assist in holding the substrate C to the plate 12, in a manner understood by those skilled in the art. It should also be understood that although the present application discusses the invention in terms of a ceramic substrate any desired alternative substrate, such as a printed circuit board, may be used.

The screen printer includes a frame F (which is broken in the illustration in FIG. 2) which holds a tightly stretched screen S. The screen S has a pattern formed therein (the boundary B of which is illustrated in FIGS. 2 and 4) corresponding to a pattern of a paste-like material that is desired to be deposited upon the surface of the ceramic substrate C. The pattern is defined by open and closed areas on the screen S in a manner well understood by those skilled in the art. Prior to the lowering of the wiper applicator (also known as a "squeegee") into contact with the screen S and the movement of the applicator across the screen the tightly stretched screen occupies a substantially planar orientation. This undeflected condition of the screen S is indicated by the character U in FIGS. 3A and 3C.

When the screen printer 10 is in its fully assembled condition the frame F is fixedly mounted to the framework 16 of the screen printer 10 whereby the screen S, in its undeflected condition, is spaced predetermined close distance 1 from the plane 44 (FIG. 3C) defined by the edge E of the applicator W as it moves across the surface of the substrate C. If the screen S has an overall length L (FIG. 2) the clearance distance 1 lies on the order of L/200. Any convenient mounting location for the frame F may be selected consistent with the discussion set forth herein.

A wiper applicator W having an edge E thereon is supported on a carrier T. The carrier T is itself mounted on a suitable leg M. The leg M is connected to the rod N of an actuator Q whereby the wiper W is moved in the direction indicated by the arrow V across the screen S. As earlier discussed a volume of composition is placed on the screen S in front of (with reference to the direction of motion V) of the wiper applicator W. As the wiper applicator W is lowered to deflect the screen S and is moved from the first end S-1 toward the second end S-2 of the screen S in the direction of the arrow V a line of contact K (FIGS. 3A, 3B, 3C) between the screen S and the substrate C is defined. This action urges the composition through the pattern (bounded by the boundary B) onto the substrate C.

The support plate 12 is mounted for pivotal movement about a pivot axis 14 by any suitable form of abutments 16A, 16B. The abutments 16A, 16B, which form part of the framework 16 of the screen printer 10, place the pivot axis 14 a predetermined known distance 18 above a predetermined reference datum, such as the surface of a frameplate 22 (which is also part of the framework 16 of the printer 10).

A movable brace assembly 24 is shown in FIG. 2 as a pair of spaced rollers 24A and 24B mounted by a respective abutments 25A, 25B on a support base 26. The brace assembly 24 is mounted for movement across the frame plate 22 in guide tracks 28A, 28B in a direction (42, FIGS. 3A, 3B, 3C) parallel the direction of motion V of the wiper applicator W. The motion of the brace assembly 24 is synchronized with that of the wiper applicator W by means of a linkage 32 which interconnects the base 26 with the rod N of the actuator Q. The brace assembly 24 extends a distance 34 above the datum defined by the frameplate 22. The distance 34 is less than the distance 18. The brace 24, and specifically the rollers 24A, 24B thereof, contact the undersurface of the plate 12 along a line of abutting support 36 that is spaced from the pivot axis 14. It should be understood that the brace assembly 24 may be otherwise implemented, as by a structure analagous to that of the wiper applicator W or as by a spike or the like, in the latter case the line of abutting support 36 would degenerate into a point of abutting support.

The plate 12 is biased by any convenient biasing means, as by springs 38, for pivotal movement about the pivot axis 14 in the direction of the arrow 40. Any convenient mounting mechanism for the biasing springs 38 may be used. Of course, any alternate bias arrangement may be used.

Figure 3A:
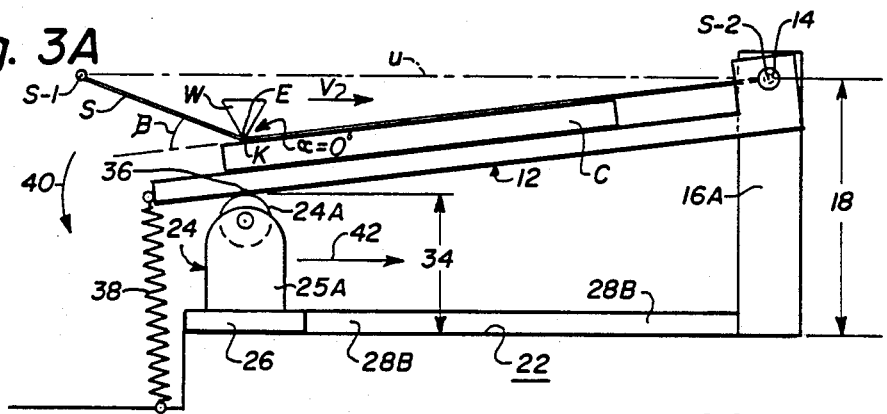
FIGS. 3A through 3C are schematic representations generally similar to FIG. 1 illustrating the relationship of the screen and the substrate using a screen printer apparatus having a pivotally movable support plate in accordance with the first embodiment of the present invention.
Figure 3B:
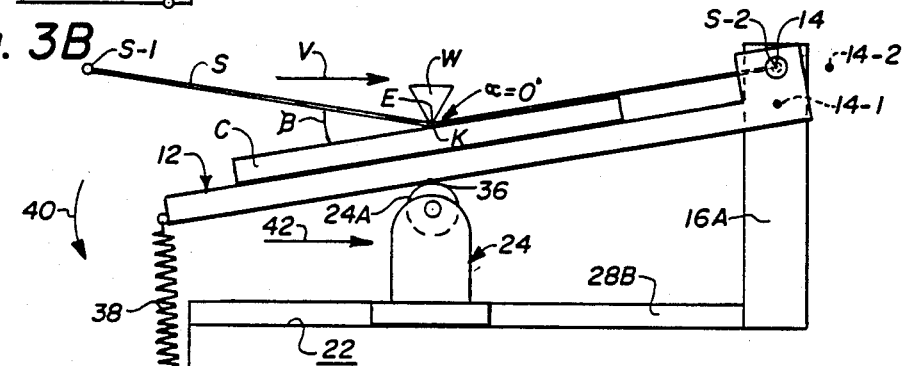
Figure 3C:
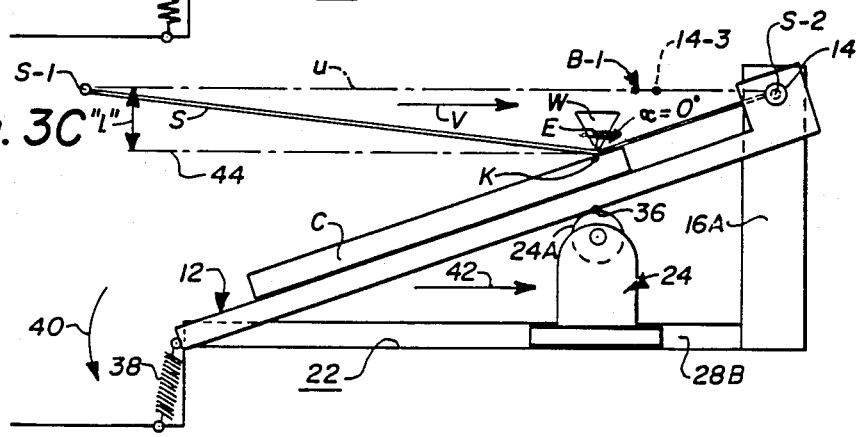
Figure 4:
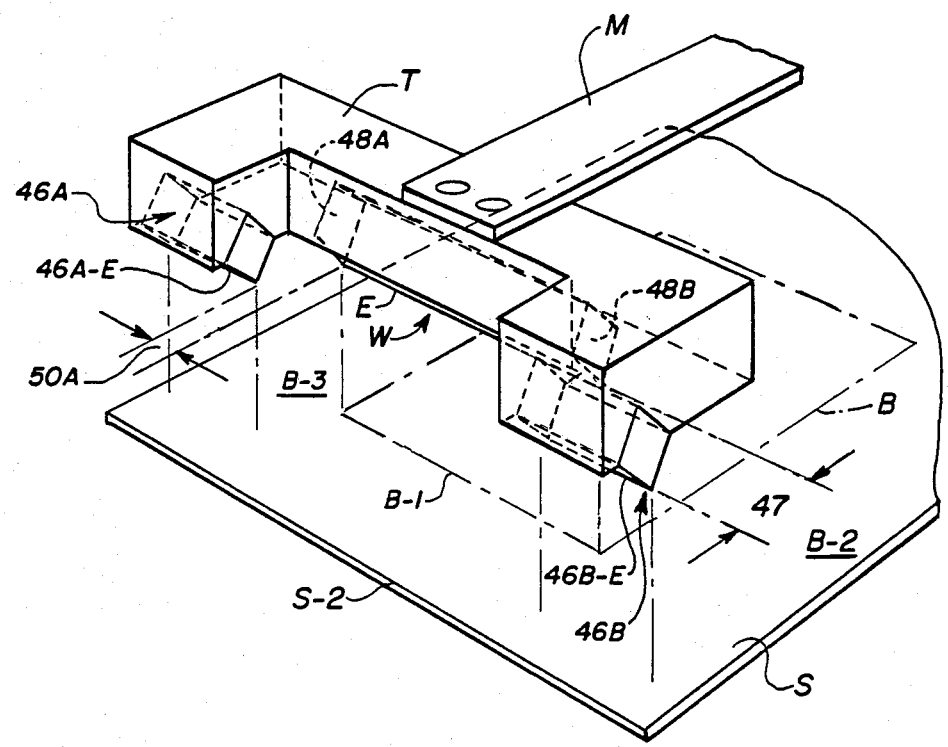
FIG. 4 is a stylized pictorial representation of a portion of a screen printer apparatus having an alternate embodiment of the present invention in accordance with which is provided an applicator having screen leveling members thereon; and, FIG. 5 is a schematic representation of the relationship of the screen and the support plate in a screen printer apparatus having an applicator in accordance with the second embodiment of the present invention.

The operation of the screen printer apparatus 10 in accordance with the first embodiment of the present invention may be best understood with reference to FIGS. 3A through 3C. These figures respectively illustrate the orientation of the various elements of the screen printer apparatus 10 at three positions during the movement of the wiper applicator W across the screen S. The undeflected condition of the screen S is indicated by the dotdash line U, as discussed above.

As is seen from FIGS. 3A through 3C as the wiper applicator W moves across the substrate C the brace assembly 24 is caused to move in the direction 42 within the tracks 28A, 28B in synchronism with and in parallelism to the wiper applicator. The line of abutting support 36 between the brace assembly 24 and the undersurface of the plate 12 is concomitantly translated as the brace assembly 24 moves in the tracks 28A, 28B. As the brace assembly 24 moves in the direction 42 toward the second end S-2 of the screen S the support plate 12 is cantilevered rearwardly from the line of abutting support 36 and is permitted to pivot in the direction of the arrow 40 in response to the biasing force applied by the spring 38. As a consequence the angle α between the screen S forwardly (in the direction of movement V of the wiper applicator W) and the substrate C is maintained at substantially zero degrees. That is to say at least a portion of the screen S forwardly (in the direction of movement V of the wiper applicator) is parallel to the surface of the substrate C. This portion of the screen S is thus maintained in close proximity (and preferably touches) the substrate C. As a result the tendency of the composition to migrate under the closed areas of the pattern on the screen S is minimized, or at the least, substantially reduced.

As may be best seen with reference to FIG. 3C prior to the movement of the wiper applicator W the screen S is mounted in the frame F and is tightly stretched (as indicated by the charactr U) so as to lie in its planar condition. When the screen is deflected by the wiper applicator W to define the line of contact K and the applicator W is moved by the actuator Q across the screen S the positions of this line of contact K lie in the plane indicated by the character 44 that is substantially parallel to the plane U.

It should also be noted that in the most preferred instance the pivot axis 14 of the support plate 12 lies adjacent to the second end S-2 of the screen S and in coincidental alignment with the end S-2. However, it should be understood that the axis 14 may be otherwise located and remain within the contemplation of the present invention. Generally speaking the pivot axis 14 of the plate 12 is disposed in the vicinity of the second end S-2 of the screen S. By "vicinity of the second end of the screen" it is meant that the pivot axis 14 is located between the end B-1 (FIG. 2) of the patterned portion of the screen and a location adjacent to the second end S-2 of the screen. The axis 14 should lie in (or slightly above or below) the plane U of the undeflected screen and substantially perpendicularly to the direction of movement V of the wiper applicator. The term "adjacent to the second end S-2" encompasses a location slightly past the end S-2 of the screen S. In view of the foregoing, as an example, as is seen in FIG. 3B the pivot axis 14 may be arranged to lie a predetermined distance, as indicated by the character 14-1, below the plane U of the undeflected screen. Another alternate location of the axis 14 as adjacent to (but slightly past) the end S-2 of the screen S is indicated in FIG. 3B by the character 14-2. As may also be seen in FIG. 3C the axis 14 may be located at the location 14-3 past the end B-1 of the pattern of the screen. It should be understood that any suitable location for the pivot axis 14 may be chosen so long as pivotal movement of the plate 12 causes the portion of the screen S forwardly (in the direction V of the motion of the applicator W) to lie parallel to and in close proximity (and preferably in contact with) the surface of the substrate. In locating the pivot axis in any alternate location it is noted that the distance 18 between the axis 14 and the datum (e.g., the frame plate 22) is greater than the distance 34 between the line of abutting support 36 and the datum 22.

FIG. 4 is a highly stylized pictorial representation of a second embodiment of the present invention in accordance with which an alternate wiper structure is provided. The use of this embodiment of the invention is alternate to the embodiment discussed in connection with FIGS. 2 and 3. As discussed earlier the main wiper applicator W is supported on the carrier T. In accordance with this embodiment of the present invention screen leveling members 46A, 46B are also provided on the carrier T. In the arrangement shown in FIG. 4 the screen leveling members 46A, 46B take the form of auxiliary wiper segments each with an edge 46A-E, 46B-E thereon. The members 46A, 46B are mounted on the carrier T so as to lie a predetermined leading distance 47 forwardly of the wiper applicator W. Preferably the members 46A, 46B are located on the carrier T so as to place the members 46A, 46B over the marginal portions B-2, B-3 of the screen S outside of the patterned area thereon indicated by the dot-dash boundary B in FIG. 4. The members 46A, 46B are preferably mounted on the carrier T and may be spaced a predetermined clearance distance 50A, 50B outwardly from the lateral ends 48A, 48B of the main wiper applicator A. (From the arrangement of FIGS. 4 and 5, only the distance 50A is clearly visible.) Of course, if the patterned area of the screen were reduced the members 46A, 46B might be aligned with the extremities of the wiper applicator W or might transversely overlap the same.

The members 46A, 46B may take any of a variety of forms. As seen from FIG. 5 a pair of rollers 52A, 52B (only one of which is visible in the Figure) may be used. Any other configuration for the members 46A, 46B may be used, consistent with their purpose as described herein.

Figure 5:
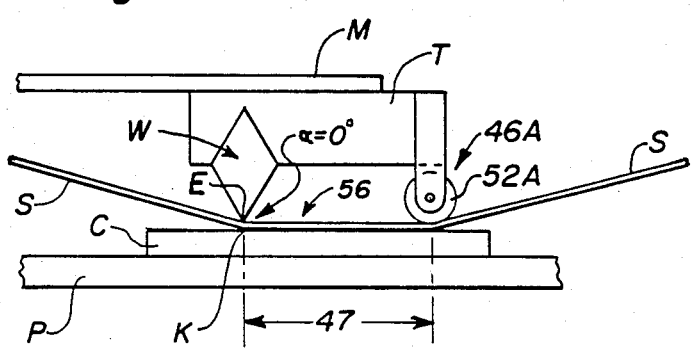

As a consequence of the described structural relationship in which the members 46A, 46B are placed forwardly of the wiper applicator W, as the wiper applicator W is moved across the pattern of the screen S the members 46A, 46B function to press a predetrmined portion 56 (FIG. 5) of the screen S forwardly of the main line of contact K and bring that portion 56 of the screen S into parallel relationship with and close proximity to the substrate C. Again, it is preferred that the angle of α be zero degrees (i.e., the screen 56 parallel to the substrate C) and that the screen S physically touch the surface of the substrate C. The situation is illustrated in FIG. 5. Since the portion 56 of the screen S is brought into close proximity with the upper surface of the substrate C the tendency of the composition to migrate beneath the closed portions of the screen is again minimized or at least substantially reduced.

Those skilled in the art having the benefit of the teachings of the present invention as herein above set forth may effect numerous modifications thereto. These modifications are, however, to be construed as lying within the scope of the present invention as defined by the appended claims.

What is claimed is:

1. In a screen printer apparatus for applying a thick film composition onto the surface of a substrate, the screen printer apparatus being of the type comprising a screen having a pattern of open and closed areas thereon, a wiper applicator, and an actuator for moving the applicator across the screen from a first end toward a second end, wherein the improvement comprises:
   a support plate for carrying the substrate, the plate being pivotally mounted about a pivot axis;
   means for biasing the plate for pivotal movement about the pivot axis;
   a brace for contacting the plate along a line of abutting support spaced from the pivot axis, the brace being movable with respect to the plate; and
   means for moving the brace with respect to the plate in synchronism with the movement of the applicator across the screen, whereby the plate pivots about the pivot axis such that a portion of the screen forwardly of the applicator is maintained in predetermined close proximity to the surface of the substrate throughout the movement of the applicator thereby to minimize migration of the composition under the closed areas of the pattern.

2. The screen printer of claim 1 wherein the pivot axis of the support plate lies a greater distance above a predetermined datum than does than line of abutting support between the brace and the plate and wherein the portion of the screen forwardly of the applicator is parallel to and in contact with the surface of the substrate.

3. The screen printer of claim 2 wherein the pivot axis of the support plate is disposed in the vicinity of the second end of the screen.

4. The screen printer of claim 1 wherein the pivot axis of the support plate is disposed in the vicinity of the second end of the screen.

5. The screen printer of claim 3 wherein the pivot axis of the support plate is coincidently aligned with the second end of the screen.

6. The screen printer of claim 4 wherein the pivot axis of the support plate is coincidently aligned with the second end of the screen.

7. The screen printer of claim 1 wherein the screen is mounted in a frame and tightly stretched to lie in a plane prior to the movement of the wiper applicator, and wherein the wiper applicator deflects the screen to define a line of contact between the screen and the substrate as the wiper applicator is moved across the screen, and wherein the plane containing the lines of contact between the screen and the substrate is parallel to the plane of the screen prior to the movement of the applicator.

8. The screen printer of claim 7 wherein the pivot axis of the support plate lies a greater distance above a predetermined datum than does the line of abutting support between the brace and the plate and wherein the portion of the screen forwardly of the applicator is parallel to and in contact with the surface of the substrate.

9. The screen printer of claim 8 wherein the pivot axis of the support plate is disposed in the vicinity of the second end of the screen.

10. The screen printer of claim 7 wherein the pivot axis of the support plate is disposed in the vicinity of the second end of the screen.

11. The screen printer of claim 10 wherein the pivot axis of the support plate is coincidently aligned with the second end of the screen.

12. The screen printer of claim 9 wherein the pivot axis of the support plate is coincidently aligned with the second end of the screen.

13. In a screen printer apparatus for applying a thick film composition onto the surface of a substrate, the screen printer apparatus being of the type comprising a screen having a pattern of open and closed areas thereon with a lateral margin on each side thereof, a wiper applicator having an applicator edge thereon, a carrier for carrying the wiper applicator, and an actuator connected to the carrier for moving the wiper applicator across the pattern of the screen in a direction of motion extending from a first end of the screen toward a second end thereof, the wiper applicator having first and second lateral ends thereon, wherein the improvement comprises:
   a first and a second screen leveling member disposed on the carrier forwardly in the direction of the motion of the wiper applicator, the leveling members being spaced from the wiper applicator, the leveling members being laterally mounted on the carrier such that the members are able to contact the screen on the lateral margins of the pattern thereon, whereby the screen leveling members each deflect the screen as the wiper applicator is moved there across to urge a portion of the screen immediately forwardly of the wiper applicator into close proximity to the substrate thereby to minimize migration of the composition under the closed areas of the pattern.

14. The screen printer of claim 13 wherein the leveling members each take the form of auxiliary applicator segment, each of which has an edge thereon.

15. The screen printer of claim 13 wherein the leveling members each take the form of a roller.

* * * * *